(12) United States Patent
Wu et al.

(10) Patent No.: US 12,324,156 B2
(45) Date of Patent: Jun. 3, 2025

(54) MEMORY DEVICES AND METHOD OF FABRICATING SAME

(71) Applicant: Taiwan Semiconductor Manufacturing Co., Ltd., Hsinchu (TW)

(72) Inventors: Chang-Ming Wu, New Taipei (TW); Wei Cheng Wu, Zhubei (TW); Shih-Chang Liu, Alian Township (TW); Harry-Hak-Lay Chuang, Zhubei (TW); Chia-Shiung Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 371 days.

(21) Appl. No.: 17/826,503

(22) Filed: May 27, 2022

(65) Prior Publication Data

US 2022/0285382 A1 Sep. 8, 2022

Related U.S. Application Data

(60) Continuation of application No. 16/869,780, filed on May 8, 2020, now Pat. No. 11,348,935, which is a (Continued)

(51) Int. Cl.
 *H01L 29/792* (2006.01)
 *H01L 21/311* (2006.01)
 (Continued)

(52) U.S. Cl.
 CPC ........ *H10B 43/30* (2023.02); *H01L 21/31116* (2013.01); *H10D 30/0413* (2025.01); *H10D 30/69* (2025.01); *H10D 30/696* (2025.01)

(58) Field of Classification Search
 CPC .............. H10B 43/30; H01L 29/66833; H01L 21/31116
 See application file for complete search history.

(56) References Cited

U.S. PATENT DOCUMENTS

| | | | |
|---|---|---|---|
| 6,803,620 B2 | 10/2004 | Moriya et al. | |
| 6,825,523 B2 | 11/2004 | Caprara et al. | |
| (Continued) | | | |

FOREIGN PATENT DOCUMENTS

| | | |
|---|---|---|
| CN | 1230786 A | 10/1999 |
| CN | 101051652 A | 10/2007 |
| (Continued) | | |

OTHER PUBLICATIONS

Tiwari, S., et al., "A silicon nanocrystals based memory," Applied Physics Letters 68, Mar. 4, 1996, pp. 1377-1379.

*Primary Examiner* — Suberr L Chi
(74) *Attorney, Agent, or Firm* — Slater Matsil, LLP

(57) ABSTRACT

A device comprises a control gate structure and a memory gate structure over a substrate, a charge storage layer formed between the control gate structure and the memory gate structure, a first spacer along a sidewall of the memory gate structure, a second spacer along a sidewall of the control gate structure, an oxide layer over a top surface of the memory gate structure, a top spacer over the oxide layer, a first drain/source region formed in the substrate and adjacent to the memory gate structure and a second drain/source region formed in the substrate and adjacent to the control gate structure.

20 Claims, 20 Drawing Sheets

Related U.S. Application Data continuation of application No. 15/413,256, filed on Jan. 23, 2017, now Pat. No. 10,665,600, which is a division of application No. 14/095,588, filed on Dec. 3, 2013, now Pat. No. 9,559,177.

(51) Int. Cl.
*H01L 29/423* (2006.01)
*H10B 43/30* (2023.01)
*H10D 30/01* (2025.01)
*H10D 30/69* (2025.01)

(56) References Cited

U.S. PATENT DOCUMENTS

| | | |
|---|---|---|
| 7,235,441 B2 | 6/2007 | Yasui et al. |
| 7,423,314 B2 | 9/2008 | Mizukoshi |
| 7,626,224 B2 | 12/2009 | Chih et al. |
| 7,663,179 B2 | 2/2010 | Shinohara et al. |
| 7,667,261 B2 | 2/2010 | Hsieh et al. |
| 7,709,874 B2 | 5/2010 | Okazaki et al. |
| 8,154,070 B2 | 4/2012 | Mizukoshi |
| 2004/0235249 A1 | 11/2004 | Schaijk |
| 2007/0228498 A1 | 10/2007 | Toba et al. |
| 2010/0255670 A1 | 10/2010 | Onda |
| 2010/0301404 A1 | 12/2010 | Kawashima |
| 2011/0121382 A1 | 5/2011 | Chakihara et al. |
| 2012/0068243 A1 | 3/2012 | Kawashima et al. |
| 2013/0026552 A1 | 1/2013 | Toh et al. |
| 2013/0126960 A1 | 5/2013 | Chakihara et al. |
| 2013/0240977 A1 | 9/2013 | Kaneoka et al. |
| 2014/0227843 A1 | 8/2014 | Tsukamoto et al. |
| 2015/0091071 A1 | 4/2015 | Wu et al. |
| 2015/0091072 A1 | 4/2015 | Wu et al. |
| 2015/0155293 A1 | 6/2015 | Wu et al. |

FOREIGN PATENT DOCUMENTS

| | | |
|---|---|---|
| CN | 101145583 A | 3/2008 |
| CN | 101425516 A | 5/2009 |
| CN | 103311286 A | 9/2013 |
| JP | 2009010035 A | 1/2009 |
| JP | 2009194221 A | 8/2009 |
| JP | 2011103401 A | 5/2011 |
| JP | 2011176348 A | 9/2011 |
| JP | 20120069651 A | 4/2012 |
| JP | 2012199362 A | 10/2012 |
| JP | 2013021262 A | 1/2013 |
| KR | 20130105443 A | 9/2013 |
| TW | 1318436 B | 12/2009 |

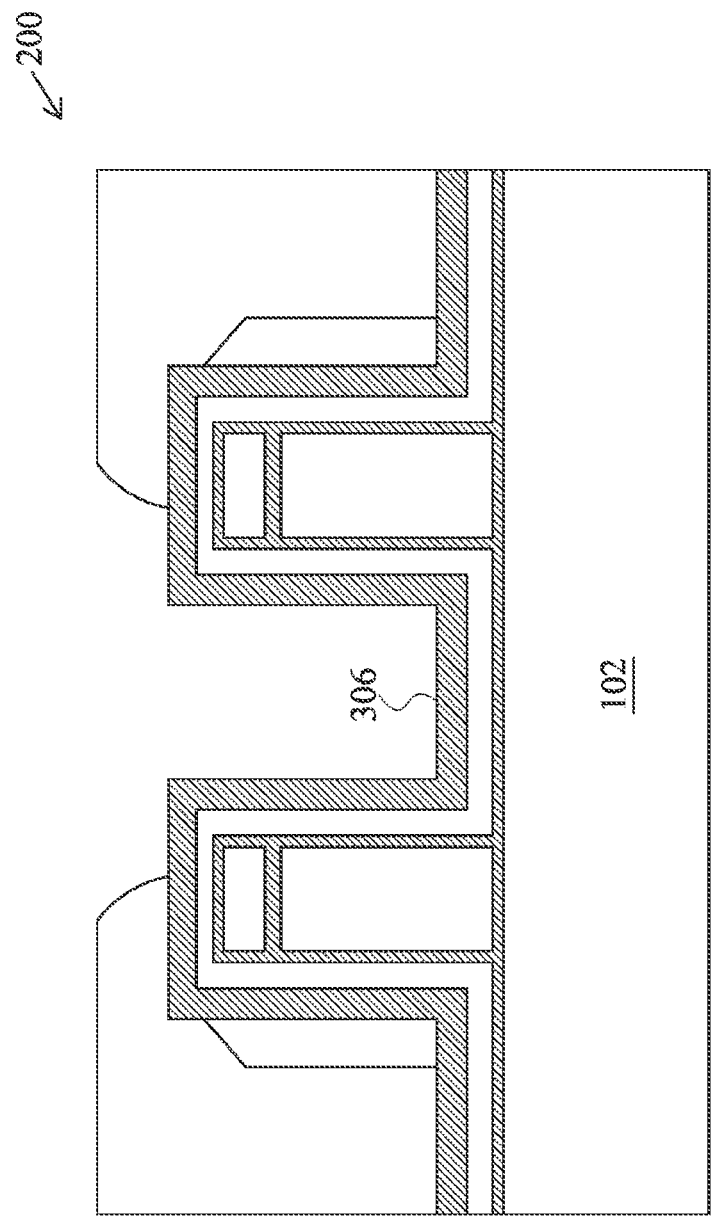

MEMORY DEVICES AND METHOD OF FABRICATING SAME

PRIORITY CLAIM AND CROSS-REFERENCE

This is a continuation application of U.S. application Ser. No. 16/869,780, entitled "Memory Devices and Method of Fabricating Same" which was filed on May 8, 2020, now U.S. Pat. No. 11,348,935, issued May 31, 2022, which is a continuation application of U.S. application Ser. No. 15/413,256, entitled "Memory Devices and Method of Fabricating Same" which was filed on Jan. 23, 2017, and issued as U.S. Pat. No. 10,665,600 on May 26, 2020, which is a divisional application of U.S. application Ser. No. 14/095,588, entitled "Memory Devices and Method of Fabricating Same" which was filed on Dec. 3, 2013 and issued as U.S. Pat. No. 9,559,177 on Jan. 31, 2017 and is incorporated herein by reference.

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

One type of EEPROM memory device is referred to as a flash memory device. Flash memories have become increasingly popular in recent years. A typical flash memory comprises a memory array having a large number of memory cells arranged in rows and columns. Each of the memory cells is fabricated as a field-effect transistor having a drain region, a source region, a control gate and a floating gate.

The floating gate is disposed above a substrate. The floating gate is between the source region and the drain region, but separated from them by an oxide layer. The floating gate may be formed of suitable materials such as polycrystalline silicon ("poly") and/or some other conductive materials. The oxide layer may be formed of silicon dioxide ($SiO_2$) and/or the like. The control gate may be disposed over the floating gate. The control gate and the floating gate may be separated by a thin oxide layer.

In operation, a floating gate is capable of holding a charge and is separated from source and drain regions contained in a substrate by an oxide layer. Each of the memory cells may be electrically charged by injecting electrons from the substrate through the oxide layer. The charge may be removed from the floating gate by tunneling the electrons to the source region or an erase gate during an erase operation. The data in flash memory cells are thus determined by the presence or absence of electrical charges in the floating gates.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 7A illustrates a cross sectional view of the semiconductor device shown in FIG. 6 after an etching process is applied to the semiconductor device in accordance with various embodiments of the present disclosure;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a flash memory device. The embodiments of the disclosure may also be applied, however, to a variety of memory devices. Hereinafter, various embodiments will be explained in detail with reference to the accompanying drawings.

Figure 1:
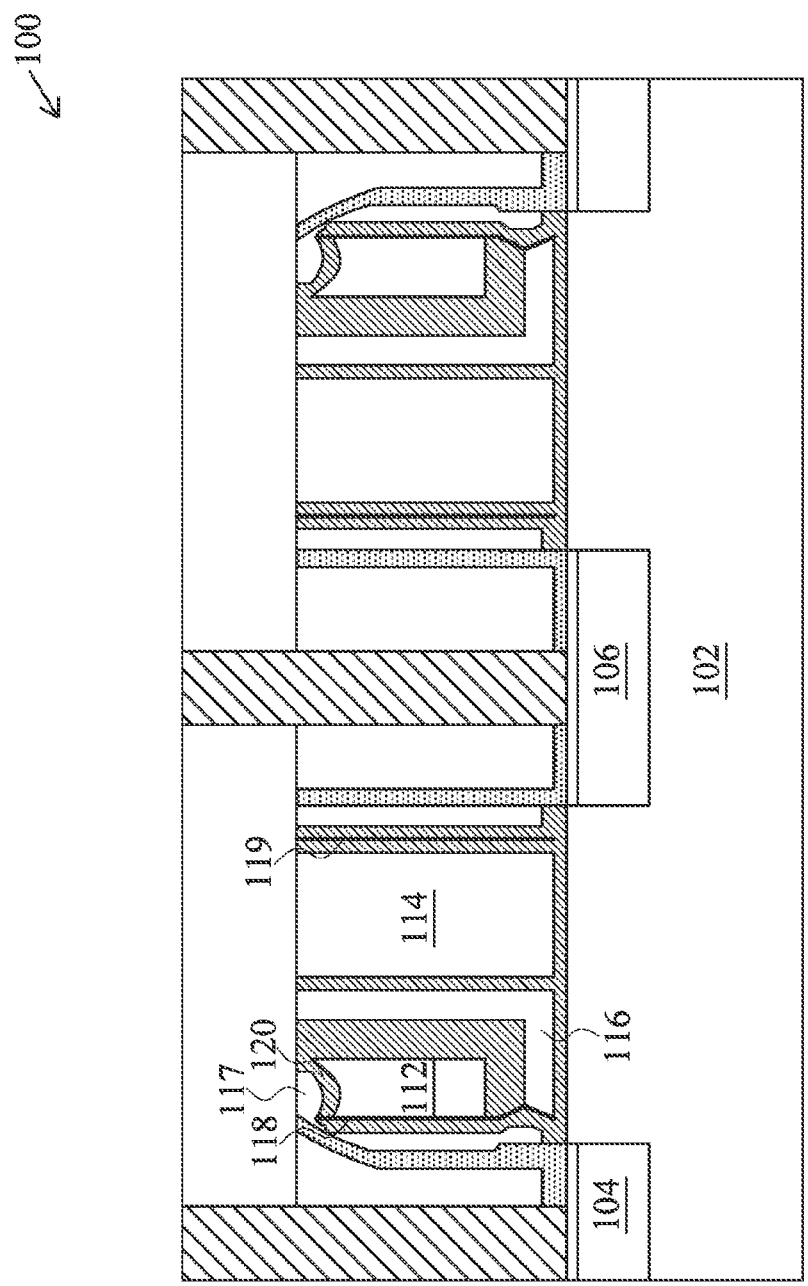
FIG. 1 illustrates a cross sectional view of a memory structure in accordance with various embodiments of the present disclosure.

FIG. 1 illustrates a cross sectional view of a memory structure in accordance with various embodiments of the present disclosure. In some embodiments, the memory structure 100 may be a flash memory cell having a first drain/source region 104 and a second drain/source region 106.

The memory structure 100 comprises a gate structure comprising a control gate 114 and a memory gate 112. Both the control gate 114 and the memory gate 112 are formed over a substrate 102. The memory structure 100 further comprises a charge storage layer 116. As shown in FIG. 1, the charge storage layer 116 is an L-shaped layer. A horizontal side of the L-shaped layer is formed between the substrate 102 and the memory gate 112. A vertical side of the L-shaped layer is formed between the memory gate 112 and the control gate 114. It should be noted that the charge storage layer 116 is enclosed by dielectric materials. As a result, the charge storage layer 116 is isolated from the memory gate 112, the control gate 114 and the substrate 102 respectively.

As shown in FIG. 1, the top surface of the memory gate 112 is protected by a dielectric layer such as a silicon nitride layer 117 and/or the like. Such a dielectric layer helps to prevent a salicide layer from being formed on top of the memory gate 112. In addition, there may be a dielectric layer 120 formed between the top surface of the memory gate 112 and the silicon nitride layer 117 as shown in FIG. 1. In some embodiments, the dielectric layer 120 is an oxide layer.

FIG. 1 also illustrates there may be a first thin spacer layer 118 formed along the sidewall of the memory gate 112. Such a spacer layer 118 helps to protect the sidewall of the memory gate 112 and form the drain/source regions in a self-aligned manner. Likewise, there may be a second thin spacer layer 119 formed along the sidewall of the control gate 114. The detailed formation process of the first thin spacer layer 118 and the second thin spacer layer 119 will be described below in detail with respect to FIG. 10 and FIG. 11.

The memory structure 100 may comprise a variety of semiconductor regions. For the purpose of clearly illustrating the inventive aspects of the various embodiments, only a few regions are described in detail herein. The rest of the semiconductor regions of the memory structure 100 will be described below with respect to FIGS. 2-17.

Figure 2:
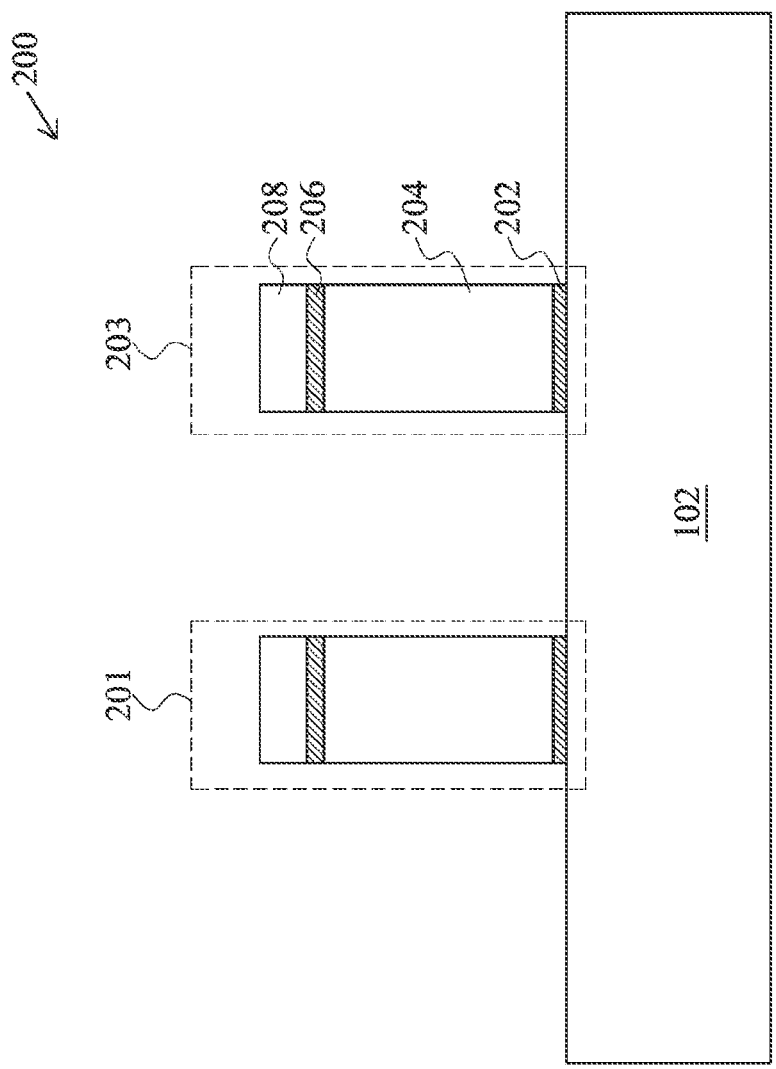
FIG. 2 illustrates a cross sectional view of a semiconductor device having a control gate formed over a substrate in accordance with various embodiments of the present disclosure.

FIGS. 2-17 illustrate intermediate steps of fabricating the memory structure shown in FIG. 1 in accordance with various embodiments of the present disclosure. FIG. 2 illustrates a cross sectional view of a semiconductor device having a control gate formed over a substrate in accordance with various embodiments of the present disclosure. As shown in FIG. 2, a plurality of gate structures 201 and 203 may be formed over the substrate 102. It should be noted while FIG. 2 illustrates two gate structures, the semiconductor device 200 may accommodate any number of gate structures.

The substrate 102 may be formed of silicon, although it may also be formed of other group III, group IV, and/or group V elements, such as silicon, germanium, gallium, arsenic, and combinations thereof. The substrate 102 may also be in the form of bulk substrate or silicon-on-insulator (SOI) substrate.

In forming the gate structures 201 and 203 shown in FIG. 2, a gate dielectric layer 202 is deposited over the substrate 102 and a gate electrode layer such as a poly layer 204 is formed over the gate dielectric layer 202. A hard mask structure including an oxide layer 206 and a nitride layer 208 is formed over the poly layer 204. To form the gate structures 201 and 203 shown in FIG. 2, a photoresist layer (not shown) may be formed over the hard mask structure and a patterning process is applied to the photoresist layer. After an etching process, the gate structures 201 and 203 are formed as shown in FIG. 2.

The gate dielectrics layer 202 may be a dielectric material, such as silicon oxide, silicon oxynitride, silicon nitride, an oxide, a nitrogen-containing oxide, a combination thereof, or the like. The gate dielectrics layer 202 may have a relative permittivity value greater than about 4. Other examples of such materials include aluminum oxide, lanthanum oxide, hafnium oxide, zirconium oxide, hafnium oxynitride, or combinations thereof.

In some embodiments, the gate electrode layer 204 may be formed of poly-silicon. The gate electrode layer 204 may be formed by depositing doped or undoped poly-silicon by low-pressure chemical vapor deposition (LPCVD) to a thickness in the range of about 400 Å to about 2,400 Å, such as about 1,400 Å.

In alternative embodiments, the gate electrode layer 204 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

Figure 3:
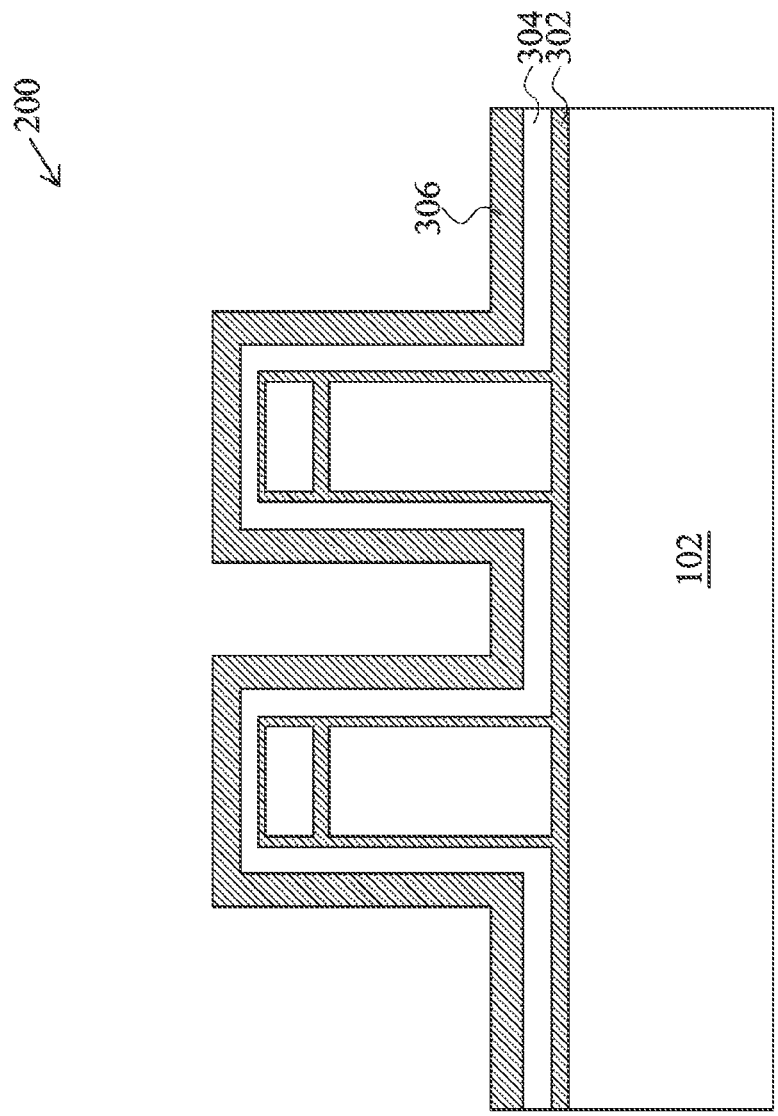
FIG. 3 illustrates a cross sectional view of a semiconductor device shown in FIG. 2 after an oxide-nitride-oxide (O—N—O) structure is formed over the gate structure shown in FIG. 2 in accordance with various embodiments of the present disclosure.

FIG. 3 illustrates a cross sectional view of a semiconductor device shown in FIG. 2 after an oxide-nitride-oxide (O—N—O) structure is formed over the gate structure shown in FIG. 2 in accordance with various embodiments of the present disclosure. The O—N—O structure includes a first oxide layer 302, a silicon nitride layer 304 and a second oxide layer 306. As shown in FIG. 3, the first oxide layer 302 is deposited over the top surface of the substrate 102, the sidewalls of the gate structures and the top surfaces of the gate structures. In some embodiments, the first oxide layer 302 is of a thickness of about 50 Å.

The silicon nitride layer 304 is formed over the first oxide layer 302. In some embodiments, the silicon nitride layer 304 is of a thickness of about 100 Å. The silicon nitride layer 304 may be formed by using suitable deposition techniques such as plasma enhanced chemical vapor deposition (PECVD) and/or the like.

As shown in FIG. 3, the second oxide layer 306 is deposited over the top surface of the silicon nitride layer 304 through suitable semiconductor deposition techniques. In some embodiments, the second oxide layer 306 is of a thickness of about 100 Å.

Figure 4:
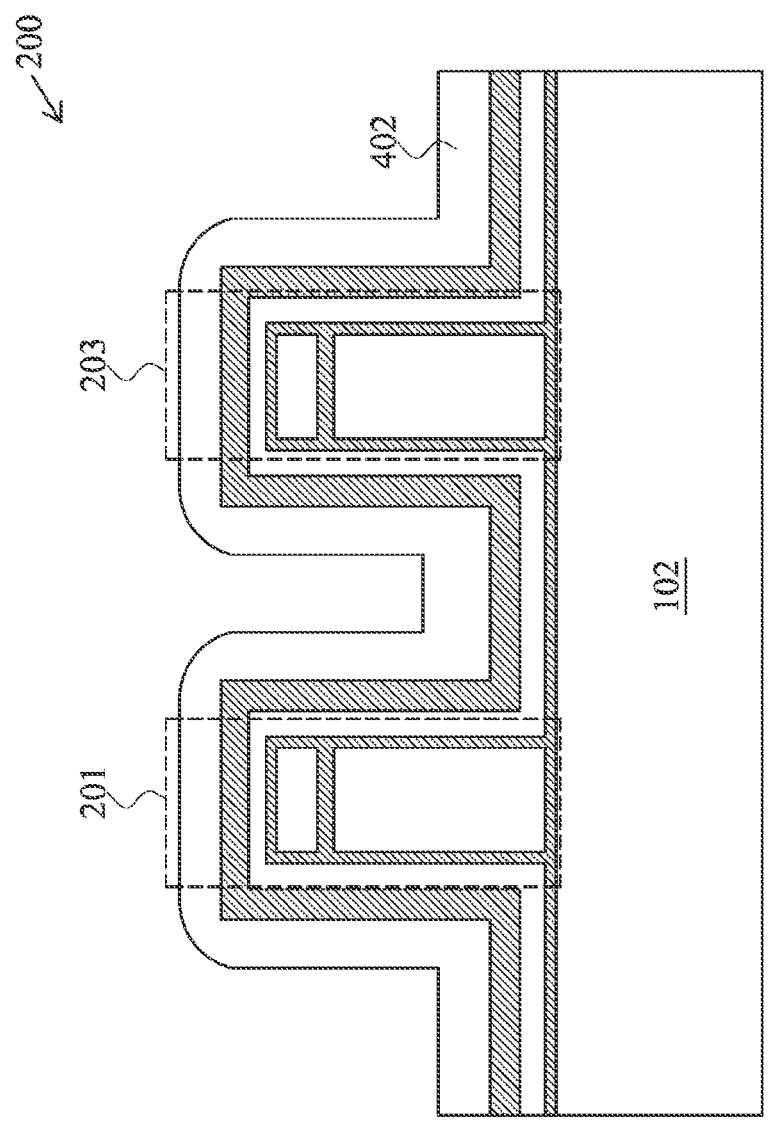
FIG. 4 illustrates a cross sectional view of the semiconductor device shown in FIG. 3 after a memory gate electrode layer is deposited over the substrate in accordance with various embodiments of the present disclosure.

FIG. 4 illustrates a cross sectional view of the semiconductor device shown in FIG. 3 after a memory gate electrode layer is deposited over the substrate in accordance with various embodiments of the present disclosure. The memory gate electrode layer 402 may be formed of suitable materials such as poly-silicon. The memory gate electrode layer 402 is deposited over the semiconductor device 200 using suitable deposition techniques such as chemical vapor deposition (CVD) and/or the like. After the memory gate electrode layer 402 is deposited over the semiconductor device 200, the control gate structures 201 and 203 may be embedded in the memory gate electrode layer 402.

Figure 5:
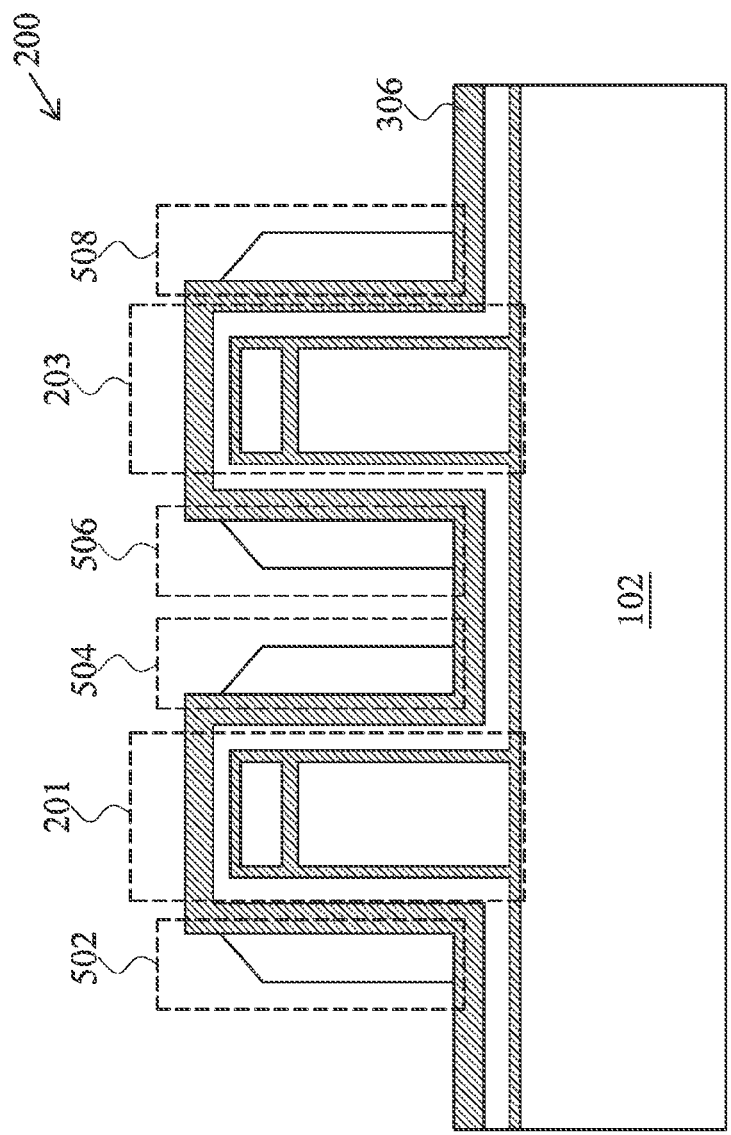
FIG. 5 illustrates a cross sectional view of the semiconductor device shown in FIG. 4 after an etching process is applied to the semiconductor device in accordance with various embodiments of the present disclosure.

FIG. 5 illustrates a cross sectional view of the semiconductor device shown in FIG. 4 after an etching process is applied to the semiconductor device in accordance with various embodiments of the present disclosure. An etching process is applied to the semiconductor device 200. By controlling the strength and direction of the etching process, portions of the memory gate electrode layer 402 have been removed. The etching process stops on the top surface of the second oxide layer 306.

As shown in FIG. 5, after the etching process finishes, there may be four resulting memory gate structures, namely a first memory gate structure 502, a second memory gate structure 504, a third memory gate structure 506 and a fourth memory gate structure 508. As shown in FIG. 5, the first memory gate structure 502 and the second memory gate structure 504 are formed along opposite sidewalls of the first control gate structure 201. Likewise, the third memory gate structure 506 and the fourth memory gate structure 508 are formed along opposite sidewalls of the second control gate structure 203.

Figure 6:
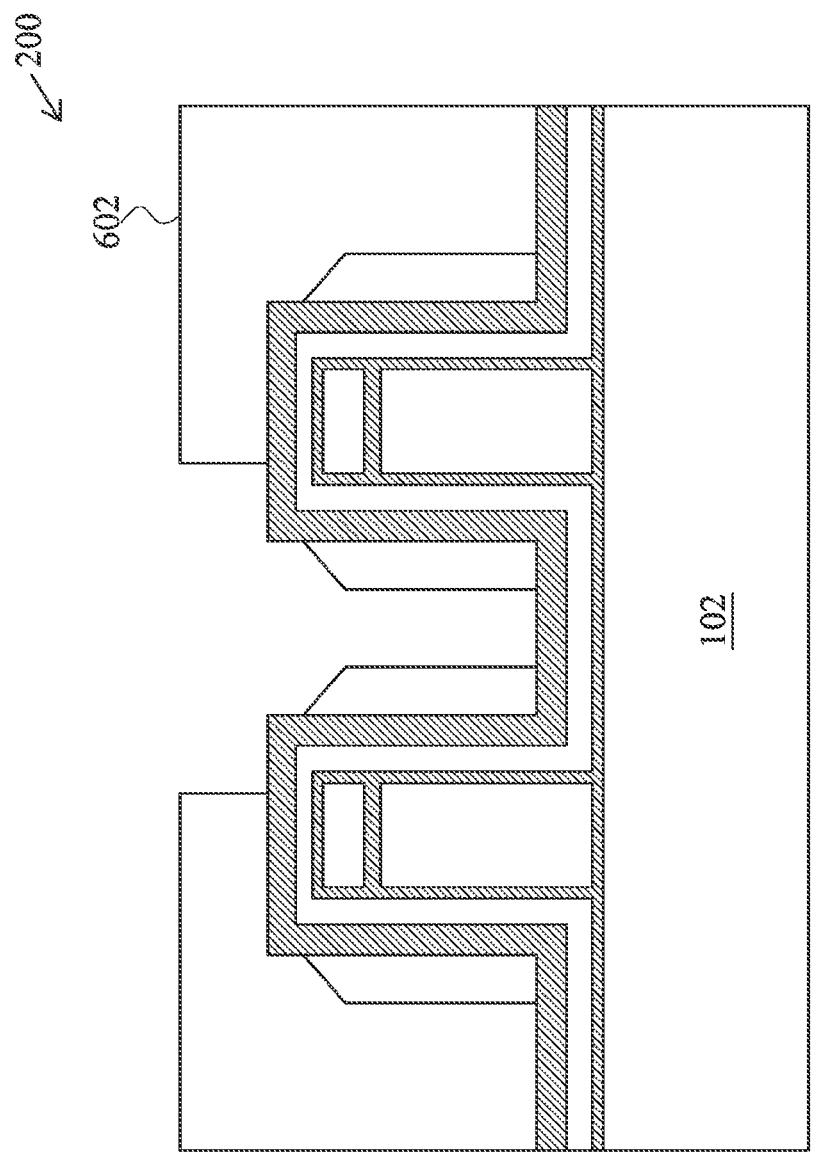
FIG. 6 illustrates a cross sectional view of the semiconductor device shown in FIG. 5 after a patterning process is applied to a photoresist layer in accordance with various embodiments of the present disclosure.

FIG. 6 illustrates a cross sectional view of the semiconductor device shown in FIG. 5 after a patterning process is applied to a photoresist layer in accordance with various embodiments of the present disclosure. The opening of a drain/source region of the semiconductor device 200 may be formed by using photolithography techniques to deposit and pattern a photoresist layer 602. A portion of the photoresist layer 602 is exposed according to the location and shape of the drain/source region. The removal of a portion of the photoresist layer 602 involves lithography operations, which are well known, and hence are not discussed in further detail herein.

FIG. 7A illustrates a cross sectional view of the semiconductor device shown in FIG. 6 after an etching process is applied to the semiconductor device in accordance with various embodiments of the present disclosure. A suitable etching process such as an isotropic dry-etch process (a.k.a. CDE) may be applied to the exposed drain/source region of the semiconductor device 200. By controlling the strength and direction of the etching process, the second memory gate structure 504 and the third memory gate structure 506 (now shown but illustrated in FIG. 5 respectively) have been removed. The etching process stops on the top surface of the second oxide layer 306.

Figure 7B:
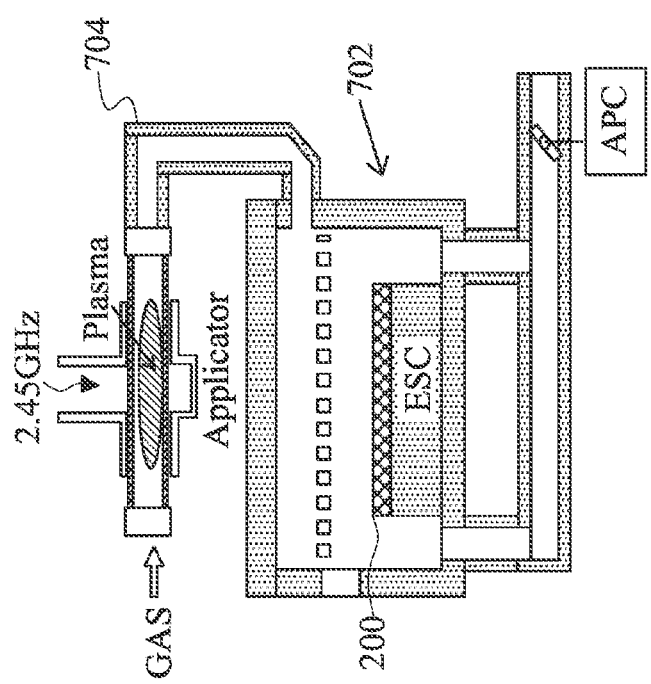
FIG. 7B illustrates a simplified diagram of the chamber of the isotropic dry-etch process in accordance with various embodiments of the present disclosure.

FIG. 7B illustrates a simplified diagram of the chamber of the isotropic dry-etch process in accordance with various embodiments of the present disclosure. The semiconductor device 200 may be placed on an electrostatic chuck (ESC) inside the chamber 702. In order to prevent the plasma source of the etching process from damaging the semiconductor device 200, the plasma source is placed outside the chamber 702 as shown in FIG. 7B. The reactive gas of the dry etching process is fed into the chamber 702 through a tube 704.

In some embodiments, the active species of the dry etching process are generated in a location away from the chamber 702 and transported into the chamber 702 through the tube 704. The etching process is implemented as a down-flow etching process. Such a down-flow etching process helps to improve the uniformity of the surface of the semiconductor device 200. The ESC shown in FIG. 7B is capable of adjusting the temperature of the semiconductor device 200 so that the semiconductor device 200 is of a stable temperature during the etching process. Moreover, an automatic pressure controller (APC) is employed to maintain a stable pressure level in the chamber 702.

The reactive gases of the dry etching process include a mixture of a first gas and a second gas. The first gas may be any CxHyFz type etching gases such as CF4, CH2F2, CHF3, any combination thereof and/or the like. The second gas may be oxygen. In some embodiments, the ratio of the first gas to the second gas is in a range from about 0.5 to about 1.5. The etching process pressure is in a range from about 200 mT to about 800 mT. The etching process power is in a range from about 200 W to about 800 W.

The flow rate of the reactive gases is in a range from about 300 Standard Cubic Centimeters per Minute (SCCM) to about 800 SCCM. The etching selectivity of silicon/oxide is maintained in a range from about 5 to about 10. Likewise, the etching selectivity of nitride/oxide is maintained in a range from about 5 to about 10.

Figure 8:
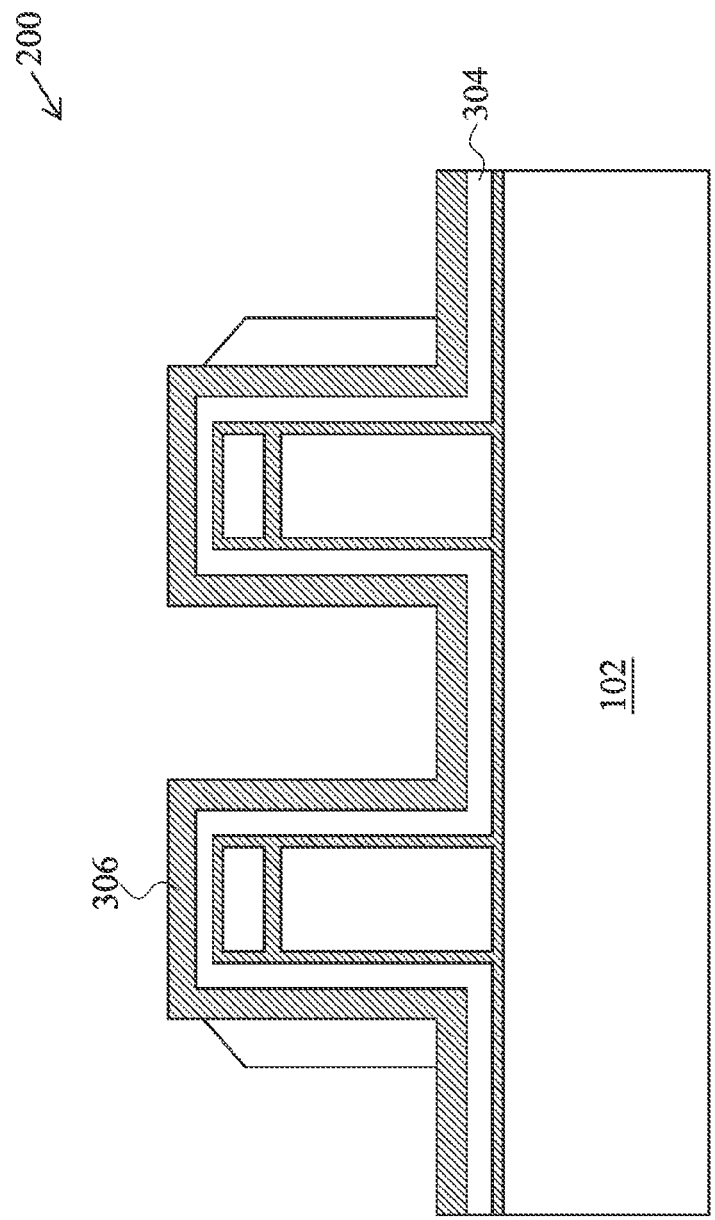
FIG. 8 illustrates a cross sectional view of the semiconductor device shown in FIG. 7A after a photoresist removal process is applied to the remaining photoresist layer in accordance with various embodiments of the present disclosure.

FIG. 8 illustrates a cross sectional view of the semiconductor device shown in FIG. 7A after a photoresist removal process is applied to the remaining photoresist layer in accordance with various embodiments of the present disclosure. The remaining photoresist layer shown in FIG. 7A may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 9:
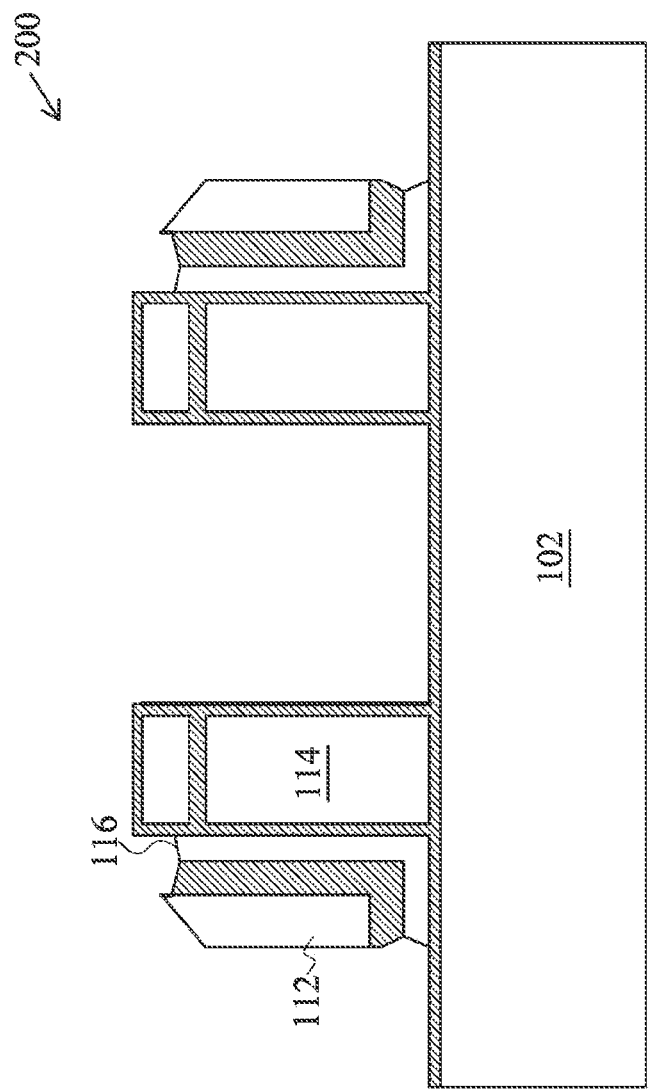
FIG. 9 illustrates a cross sectional view of the semiconductor device shown in FIG. 8 after an etching process is applied to the second oxide layer and the silicon nitride layer in accordance with various embodiments of the present disclosure.

FIG. 9 illustrates a cross sectional view of the semiconductor device shown in FIG. 8 after an etching process is applied to the second oxide layer and the silicon nitride layer in accordance with various embodiments of the present disclosure. An etching process such as a wet etching process is applied to the second oxide layer 306 and the silicon nitride layer 304 (not shown but illustrated in FIG. 8). As shown in FIG. 9, a majority of the second oxide layer 306 and the silicon nitride layer 304 has been removed as a result. The remaining portion of the second oxide layer includes two L-shaped structures situated between the memory gates (e.g., memory gate 112) and their respective control gates (e.g., control gate 114).

Likewise, the remaining portion of the silicon nitride layer includes two L-shaped structures. The L-shaped silicon nitride layers such as layer 116 may function as a charge storage layer for the semiconductor device 200.

Figure 10:
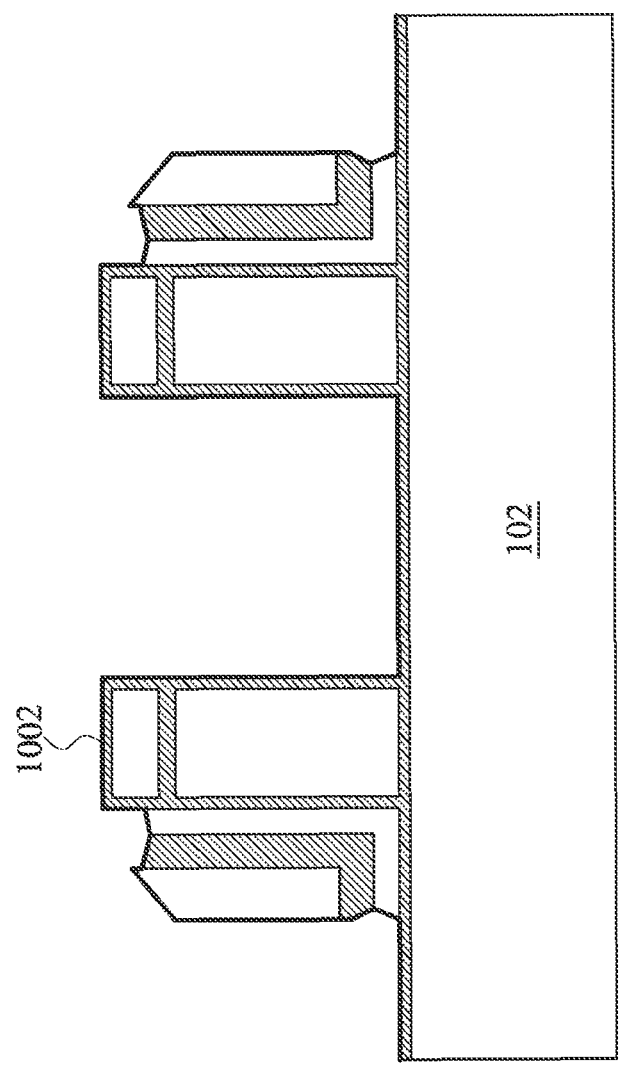
FIG. 10 illustrates a cross sectional view of the semiconductor device shown in FIG. 9 after a spacer layer is formed over the semiconductor device in accordance with various embodiments of the present disclosure.

FIG. 10 illustrates a cross sectional view of the semiconductor device shown in FIG. 9 after a spacer layer is formed over the semiconductor device in accordance with various embodiments of the present disclosure. The spacer layer 1002 may be formed by blanket depositing one or more spacer layers over the semiconductor device 200. The spacer layer 1002 may comprise suitable materials such as SiN, oxynitride, SiC, SiON, oxide, and the like and may be formed by commonly used methods such as CVD, PECVD, sputter, and other methods known in the art.

Figure 11:
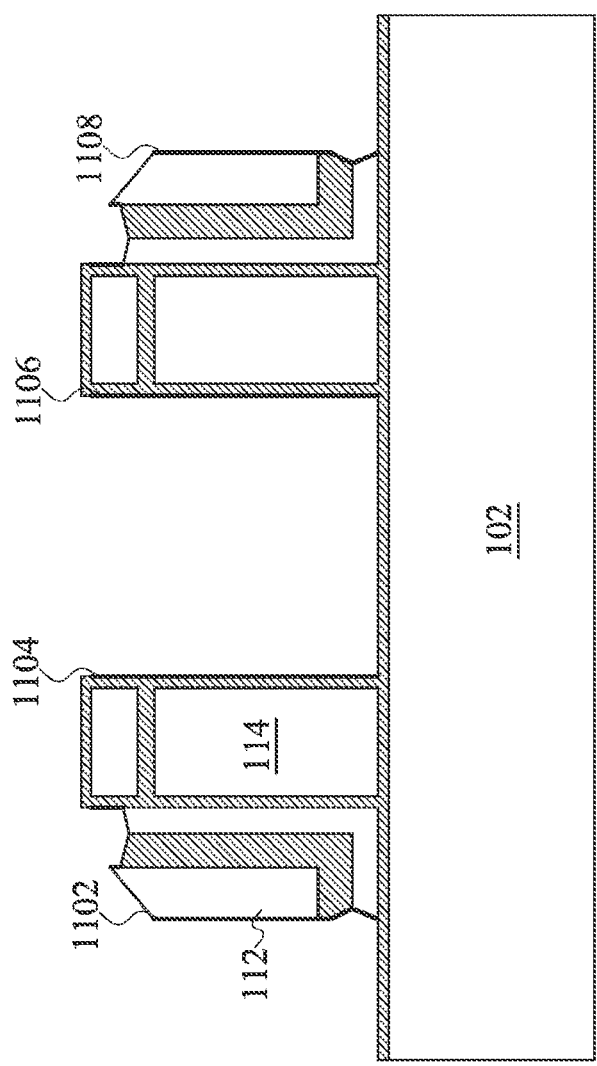
FIG. 11 illustrates a cross sectional view of the semiconductor device shown in FIG. 10 after a plurality of spacers are formed in accordance with various embodiments of the present disclosure.

FIG. 11 illustrates a cross sectional view of the semiconductor device shown in FIG. 10 after a plurality of spacers are formed in accordance with various embodiments of the present disclosure. The spacer layer 1002 may be patterned, such as by isotropically or anisotropically etching, thereby removing the spacer layer from the horizontal surfaces of the structure and forming the spacers 1102, 1104, 1106 and 1108 as illustrated in FIG. 11. As shown in FIG. 11, a first thin spacer layer 1102 is formed along a sidewall of the memory gate 112. A second thin spacer layer 1104 is formed along a sidewall of the control gate 114. Similarly, a third thin spacer layer 1106 is formed along a sidewall of another control gate and a fourth thin spacer layer 1108 is formed along a sidewall of another memory gate as shown in FIG. 11.

Figure 12:
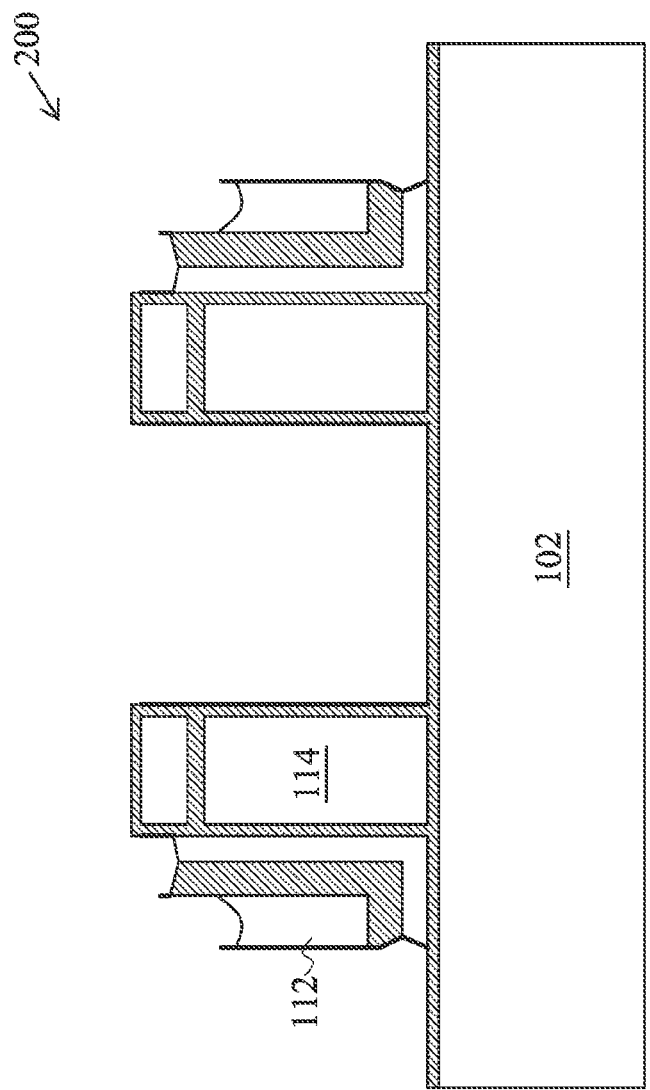
FIG. 12 illustrates a cross sectional view of the semiconductor device shown in FIG. 11 after an etching process is applied to the semiconductor device in accordance with various embodiments of the present disclosure.

FIG. 12 illustrates a cross sectional view of the semiconductor device shown in FIG. 11 after an etching process is applied to the semiconductor device in accordance with various embodiments of the present disclosure. A suitable etching process such as an isotropic dry etch process is applied to the exposed portions of the memory gate 112. As a result, an upper portion of the memory gate 112 has been removed. The isotropic dry etch process has been described above with respect to FIG. 7A and FIG. 7B, and hence is not discussed again to avoid unnecessary repetition.

Figure 13:
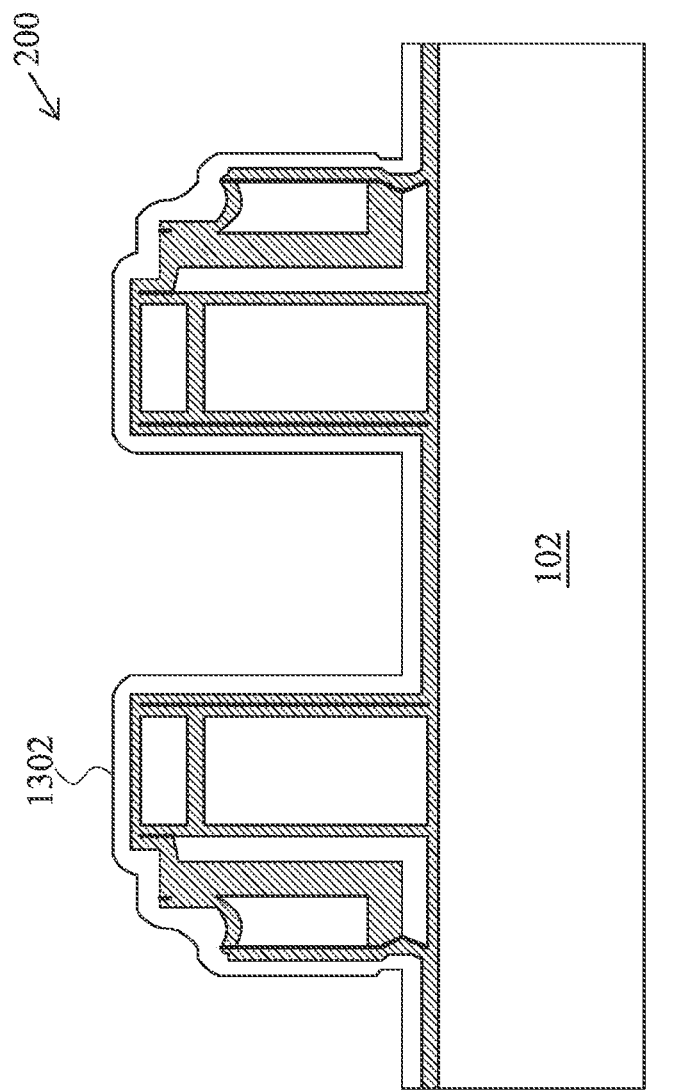
FIG. 13 illustrates a cross section view of the semiconductor device shown in FIG. 12 after a spacer deposition is applied to the semiconductor device in accordance with various embodiments of the present disclosure.

FIG. 13 illustrates a cross section view of the semiconductor device shown in FIG. 12 after a spacer deposition is applied to the semiconductor device in accordance with various embodiments of the present disclosure. The spacer layer 1302 may be formed by blanket depositing one or more spacer layers over the semiconductor device 200. The spacer layer 1302 may comprise SiN and/or the like and may be formed by commonly used methods such as CVD, PECVD, sputter, and other methods known in the art.

Figure 14:
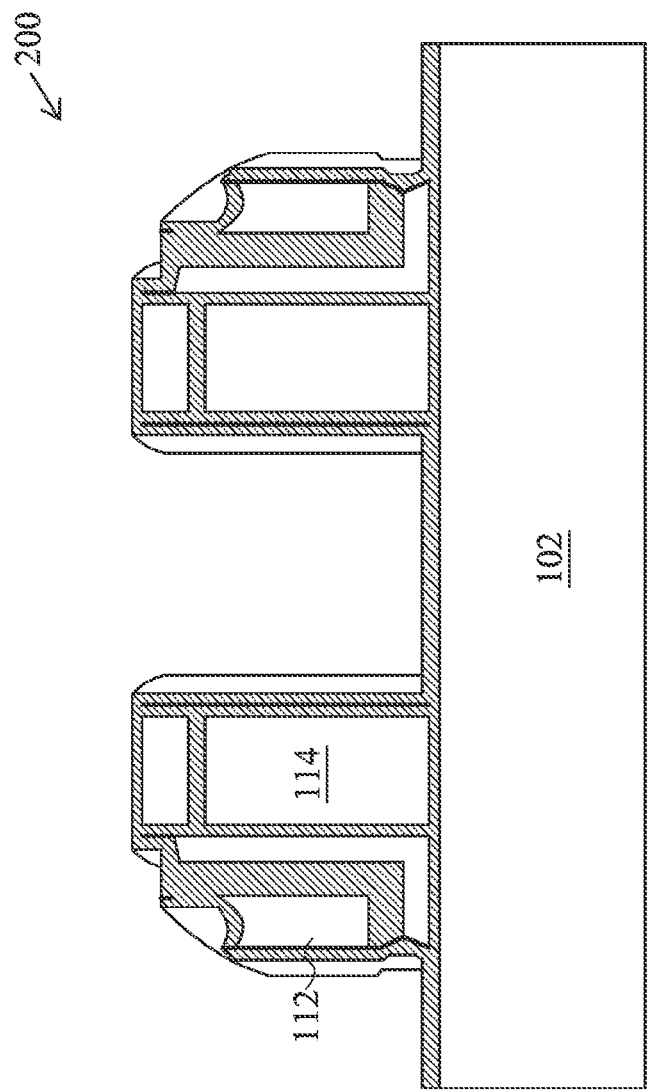
FIG. 14 illustrates a cross sectional view of the semiconductor device shown in FIG. 13 after an etching process is applied to the spacer layer shown in FIG. 13 in accordance with various embodiments of the present disclosure.

FIG. 14 illustrates a cross sectional view of the semiconductor device shown in FIG. 13 after an etching process is applied to the spacer layer shown in FIG. 13 in accordance with various embodiments of the present disclosure. The spacer layer 1302 may be patterned, such as by isotropically or anisotropically etching, thereby removing the spacer layer over the drain/source regions and the spacer layer over the control gates. It should be noted that as shown in FIG. 14, the top surface of the memory gate 112 is covered by the remaining portion of the spacer layer 1302. Such a spacer layer helps to prevent a salicide layer from being formed over the memory gate 112.

Figure 15:
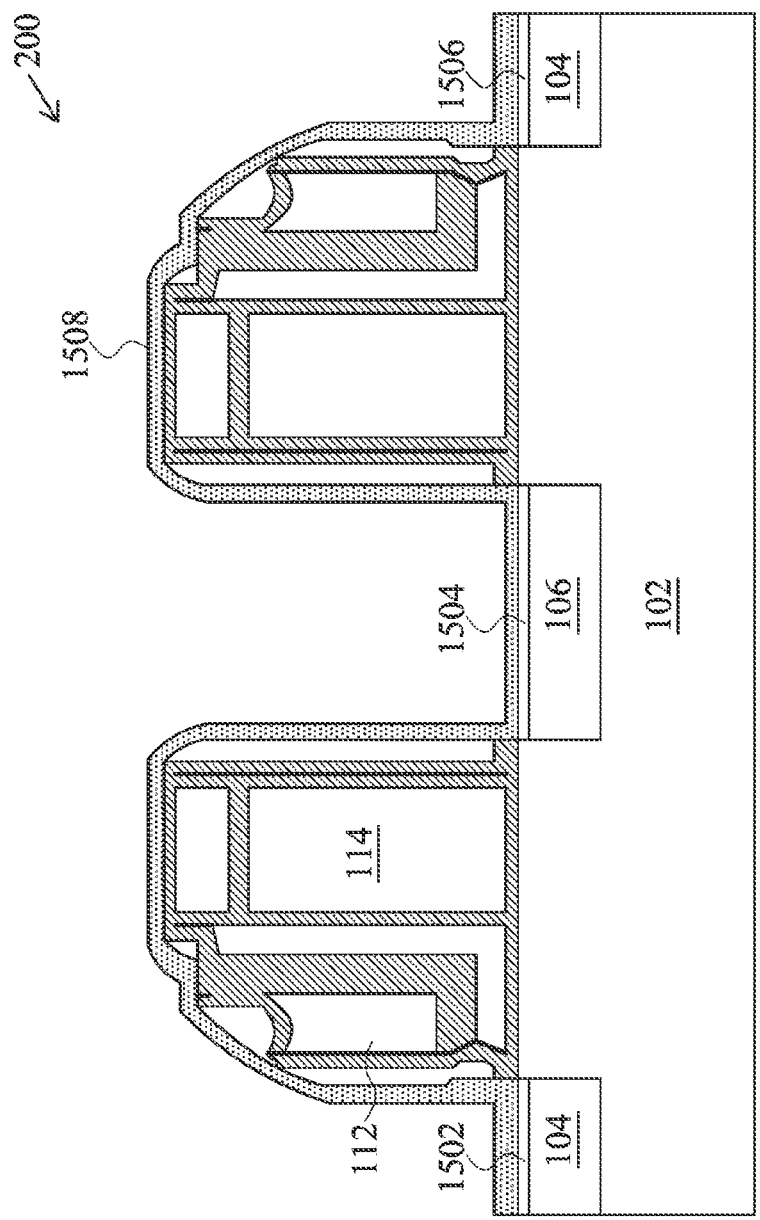
FIG. 15 illustrates a cross section view of the semiconductor device shown in FIG. 14 after drain/source regions, silicide regions and a contact etch stop layer (CESL) are formed on the semiconductor device in accordance with various embodiments of the present disclosure.

FIG. 15 illustrates a cross section view of the semiconductor device shown in FIG. 14 after drain/source regions, silicide regions and a contact etch stop layer (CESL) are formed on the semiconductor device in accordance with various embodiments of the present disclosure. The drain/source regions 104 and 106 may be formed through an ion implantation process. As is known to those of skill in the art, the use of dopant atoms in an implant step may form the drain/source regions 104 and 106 with a particular conductivity type. Depending on different applications, the drain/source regions 104 and 106 may be n-type or p-type.

In some embodiments, the drain/source regions 104 and 106 may be a p-type region. Appropriate p-type dopants such as boron, gallium, indium and/or the like are implanted into the substrate 102 to form the drain/source regions 104 and 106. Alternatively, the drain/source regions 104 and 106 may be an n-type region. Appropriate n-type dopants such as phosphorous, arsenic and/or the like are implanted into the substrate 102 to form the drain/source regions 104 and 106.

The silicide regions 1502, 1504 and 1506 are formed by a salicide process. In a salicide process, a thin layer of metal is blanket deposited over a semiconductor wafer having exposed drain/source regions. The wafer is then subjected to one or more annealing steps. This annealing process causes the metal to selectively react with the exposed silicon of the source/drain regions, thereby forming metal silicide regions 1502, 1504 and 1506 over the drain/source regions. The process is referred to as a self-aligned silicidation process because the silicide layer is formed only where the metal material directly contacts the silicon drain/source regions and the gate electrodes.

In some embodiments, silicide regions 1502, 1504 and 1506 comprise metals that react with silicon such as titanium, platinum, cobalt and the like. However, other metals, such as manganese, palladium and the like, can also be used.

The CESL 1508 may comprise commonly used dielectric materials, such as silicon nitride, silicon oxynitride, silicon oxycarbide, silicon carbide, combinations thereof, and multi-layers thereof. The CESL 1508 is deposited over the semiconductor device through suitable deposition techniques such as sputtering, CVD and the like.

Figure 16:
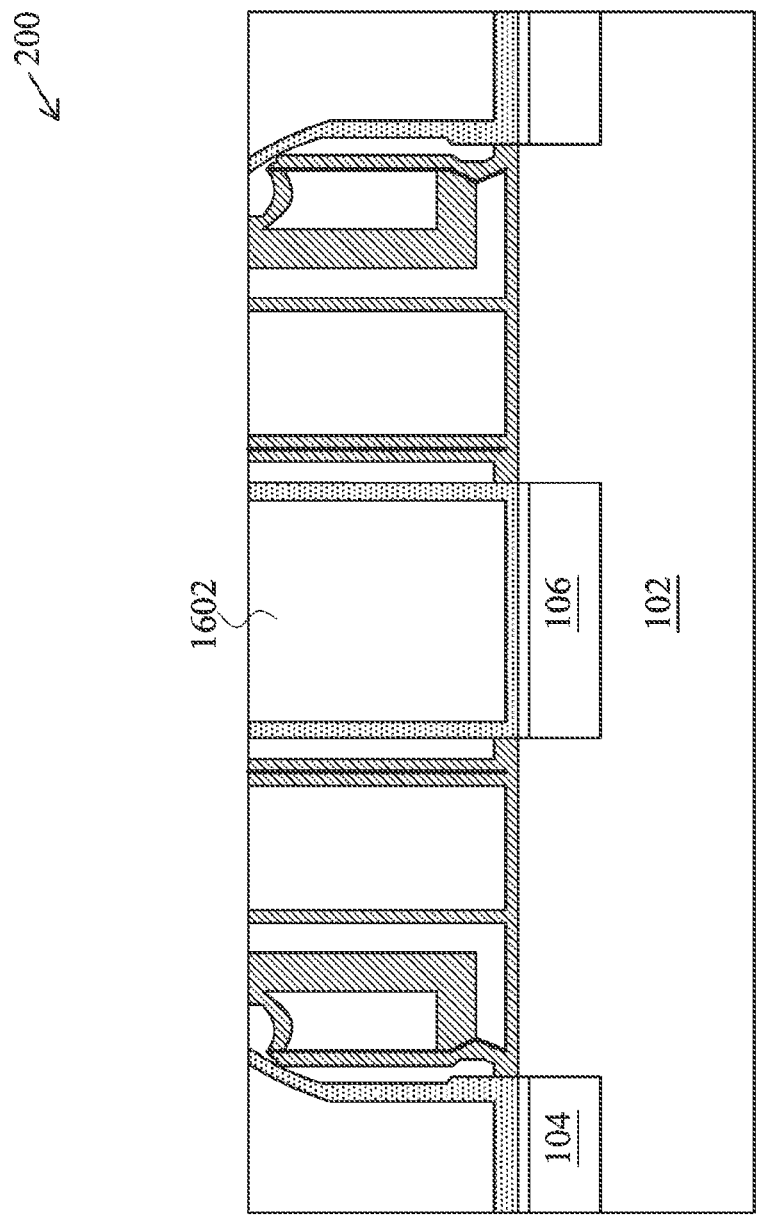
FIG. 16 illustrates a cross section view of the semiconductor device shown in FIG. 15 after an inter-layer dielectric (ILD) layer may be formed over the CESL layer and a chemical mechanical polish (CMP) process is applied to the top surface of the semiconductor device in accordance with various embodiments of the present disclosure.

FIG. 16 illustrates a cross section view of the semiconductor device shown in FIG. 15 after an inter-layer dielectric (ILD) layer 1502 may be formed over the CESL layer and a chemical mechanical polish (CMP) process is applied to the top surface of the semiconductor device in accordance with various embodiments of the present disclosure. The inter-layer dielectric (ILD) layer 1602 may be formed over the CESL 1508. The ILD layer 1602 may be formed by chemical vapor deposition, sputtering, or any other methods known and used in the art for forming an ILD, using, e.g., tetra-ethyl-ortho-silicate (TEOS) and oxygen as a precursor. The ILD layer 1602 may be about 4,000 Å to about 13,000 Å in thickness, but other thicknesses may be used. The ILD layer 1602 may comprise doped or undoped silicon oxide, although other materials such as silicon nitride doped silicate glass, high-k materials, combinations of these, or the like, may alternatively be utilized.

A planarization process, such as CMP, etch back step and the like, may be performed to planarize the top surface of the ILD layer 1602. As shown in FIG. 16, a portion of the ILD layer 1602 has been removed as a result.

Figure 17:
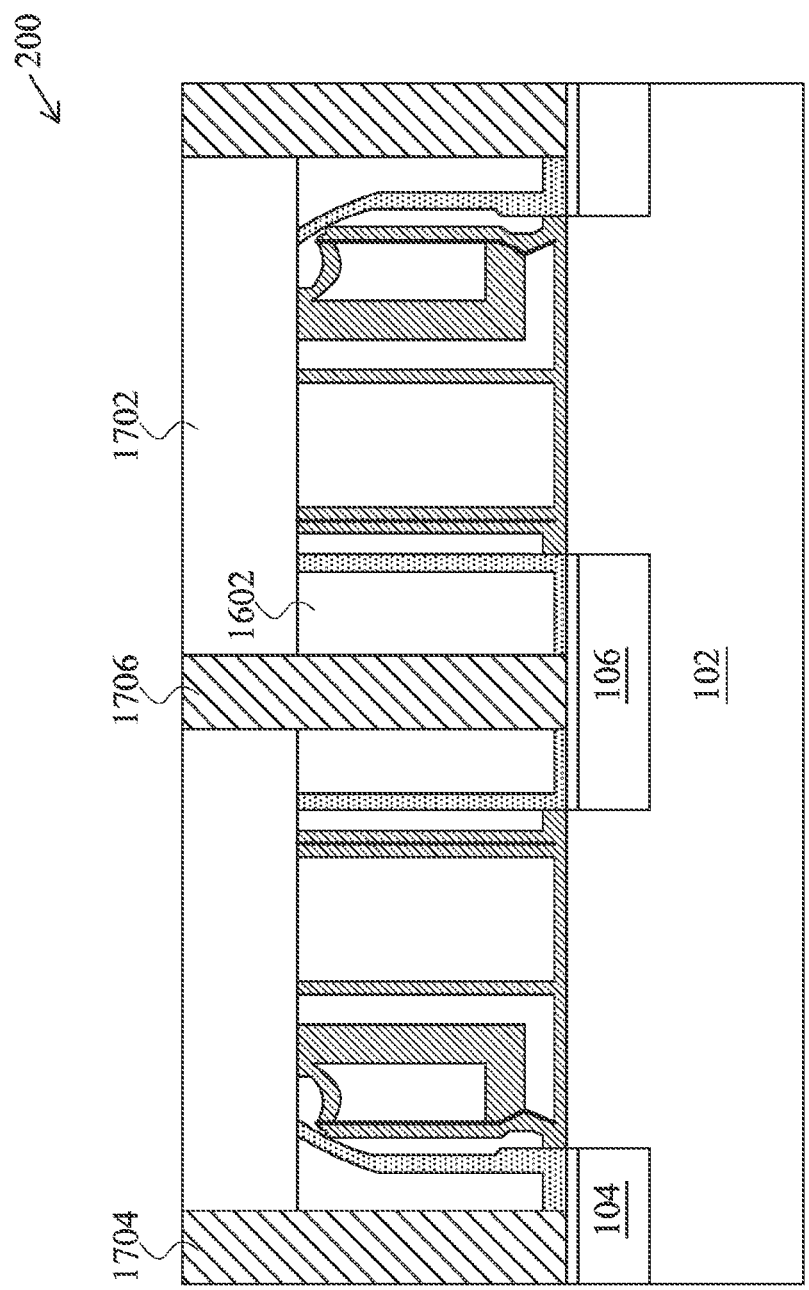
FIG. 17 illustrates a cross section view of the semiconductor device shown in FIG. 16 after a variety of contacts are formed in the semiconductor device in accordance with various embodiments of the present disclosure.

FIG. 17 illustrates a cross section view of the semiconductor device shown in FIG. 16 after a variety of contacts are formed in the semiconductor device in accordance with various embodiments of the present disclosure. A dielectric layer 1702 may be formed over the ILD layer 1602. A plurality of openings (not shown) may be formed by etching the dielectric layer 1702 as well as the ILD layer 1602. With the help of the CESL layer 1302, the etching process of the dielectric layer 1702 and the ILD layer 1602 is more precisely controlled. The CESL layer 1302, the ILD layer 1602 and the dielectric layer 1702 in the openings are also removed, thereby exposing the underlying silicide regions over the drain/source regions 104 and 106.

A metallic material, which includes tungsten, titanium, aluminum, copper, any combinations thereof and/or the like, is filled into the openings, forming contact plugs 1704 and 1706.

Figure 18:
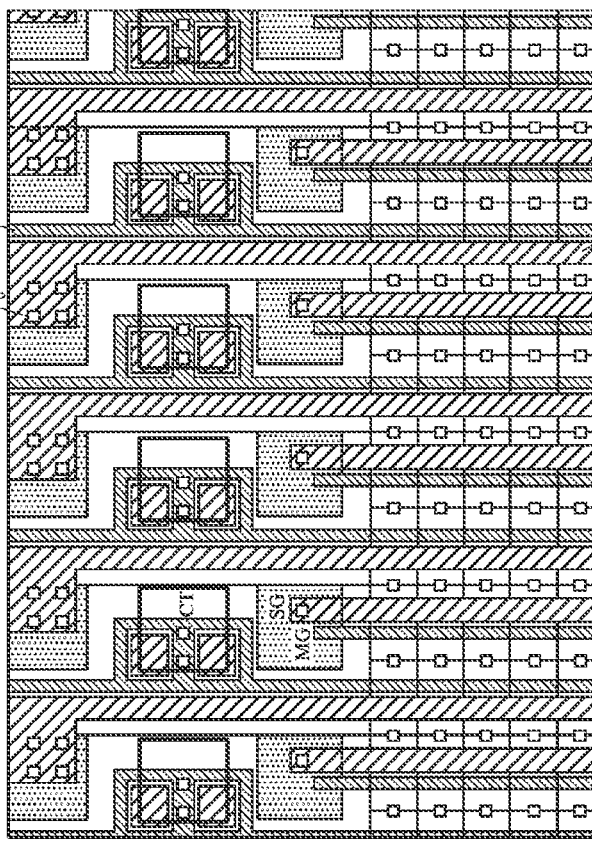
FIG. 18 illustrates a top view of a memory structure in accordance with various embodiments of the present disclosure.

FIG. 18 illustrates a top view of a memory structure in accordance with various embodiments of the present disclosure. The memory structure 1802 includes a plurality of memory cells arranged in rows and columns. As shown in FIG. 18, a memory gate structure 1804 and the control gate structure 1806 are placed in parallel. The control gate structure 1806 has its own contacts 1808 as shown in FIG. 18. The formation of the contacts of the memory gate structure includes forming an opening adjacent to the memory gate structure 1804, filling a conductive material or a variety of conductive materials into the opening to form a conductive region, wherein the conductive region is electrically coupled to the memory gate structure 1804 and forming a plurality of contact plugs over the conductive region.

Figure 19:
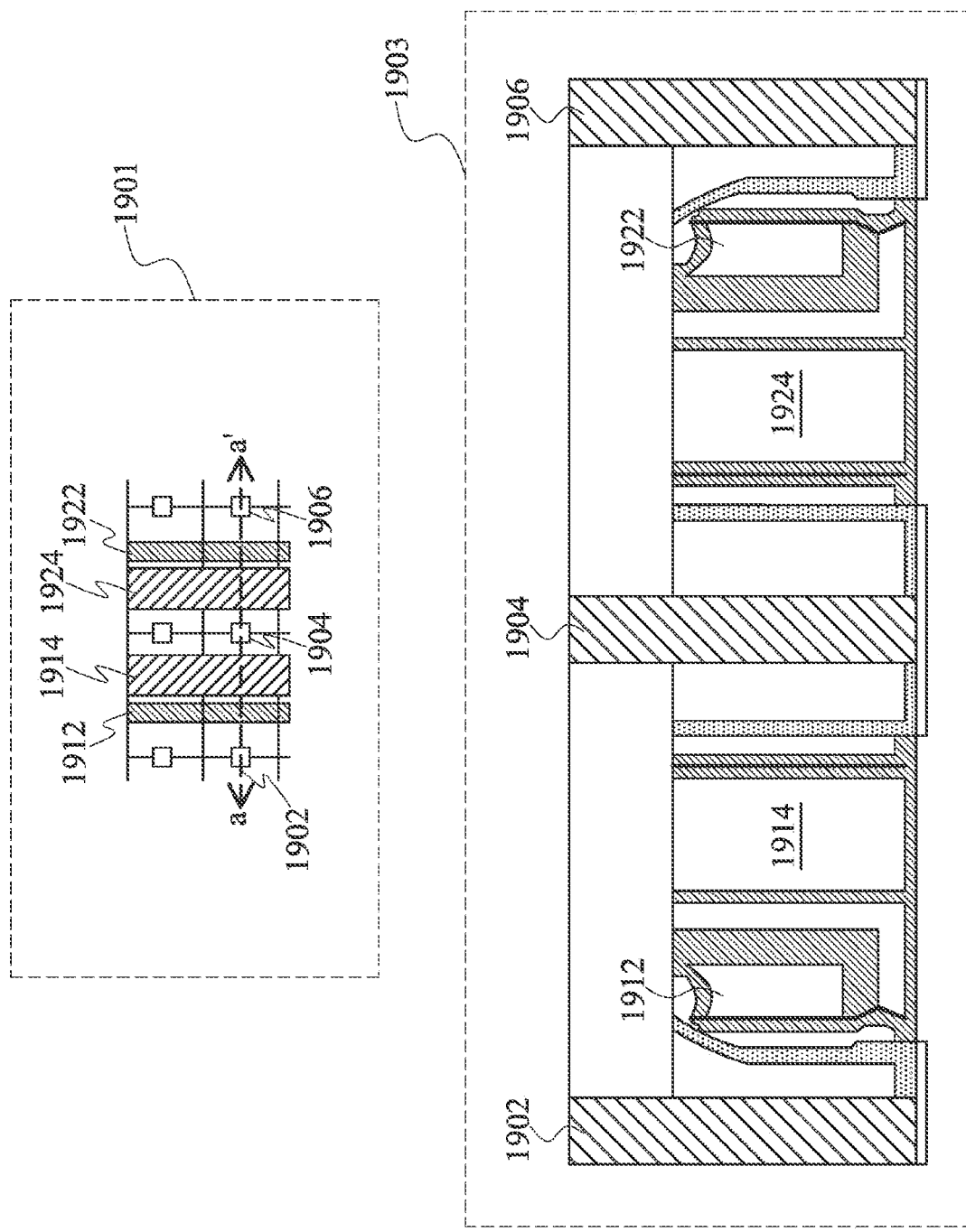
FIG. 19 illustrates a top view and a cross sectional view of the memory structure in accordance with various embodiments of the present disclosure.

FIG. 19 illustrates a top view and a cross sectional view of the memory structure in accordance with various embodiments of the present disclosure. The top view 1901 shows a portion of the top view shown in FIG. 18. The cross sectional view shown in FIG. 19 is taken along line a-a' of the top view 1901. As shown in FIG. 19, a first memory gate 1912 and a first control gate 1914 are placed in parallel. Likewise, a second memory gate 1922 and a second control gate 1924 are placed in parallel. Three contact plugs 1902, 1904 and 1906 are formed over the drain/source regions as shown in FIG. 19.

In accordance with an embodiment, an apparatus comprises a control gate structure and a memory gate structure over a substrate, a charge storage layer formed between the control gate structure and the memory gate structure, a first spacer along a sidewall of the memory gate structure, a second spacer along a sidewall of the control gate structure, an oxide layer over a top surface of the memory gate structure, a top spacer over the oxide layer, a first drain/source region formed in the substrate and adjacent to the memory gate structure and a second drain/source region formed in the substrate and adjacent to the control gate structure.

In accordance with an embodiment, a device comprises a control gate structure and a memory gate structure over a substrate, an L-shaped charge storage layer formed between the control gate structure and the memory gate structure, an L-shaped dielectric layer between the L-shaped charge storage layer and the memory gate structure, a first spacer along a sidewall of the memory gate structure, a second spacer along a sidewall of the control gate structure and a top spacer over the memory gate structure.

In accordance with an embodiment, a device comprises a control gate structure over a substrate, a memory gate structure over the substrate, an L-shaped silicon nitride layer formed between the control gate structure and the memory gate structure, a first spacer along a sidewall of the memory gate structure, a second spacer along a sidewall of the control gate structure, a top silicon nitride layer over the memory gate structure, a first drain/source region formed in the substrate and adjacent to the memory gate structure and a second drain/source region formed in the substrate and adjacent to the control gate structure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a control gate structure over a substrate;
   depositing a charge storage layer on a first side of the control gate structure;
   depositing a memory gate layer over the charge storage layer;
   applying a first etching process to the memory gate layer to form a memory gate structure adjacent the control gate structure;
   applying a second etching process to the charge storage layer to form a charge storage structure, wherein the charge storage structure extends between the memory gate structure and the control gate structure;
   forming a first spacer layer over the memory gate structure and the control gate structure;
   applying a third etching process to remove the first spacer layer from an upper surface of the memory gate structure and the control gate structure, remaining portions of the first spacer layer comprising a spacer along a sidewall of the memory gate structure, wherein a top surface of the memory gate structure is exposed after applying the third etching process to the first spacer layer;
   recessing the memory gate structure while the spacer is along the sidewall of the memory gate structure; and
   forming a top spacer over the memory gate structure after removing a portion of the memory gate structure.

2. The method of claim 1, further comprising:
   forming a first dielectric layer, wherein the charge storage layer is deposited on the first dielectric layer; and
   forming a second dielectric layer on the charge storage layer.

3. The method of claim 2, wherein the charge storage layer comprises a nitride layer, wherein the first dielectric layer comprises a first oxide layer, and wherein the second dielectric layer comprises a second oxide layer.

4. The method of claim 1, further comprising:
   removing the memory gate layer from a second side of the control gate structure opposite the memory gate structure.

5. The method of claim 1, wherein the first spacer layer comprises SiN, oxynitride, SiC, or SiON.

6. The method of claim 1, wherein after recessing the memory gate structure, the upper surface of the memory gate structure is recessed lower than an upper surface of the charge storage structure.

7. The method of claim 1, wherein after recessing the memory gate structure, the upper surface of the memory gate structure is concave.

8. A method comprising:
forming a control gate structure over a substrate;
forming a first insulating layer along a first sidewall of the control gate structure;
forming a charge storage layer over the first insulating layer;
forming a second insulating layer over the charge storage layer;
forming a memory gate structure along a sidewall of the control gate structure;
removing portions of the second insulating layer and the charge storage layer;
forming a first spacer along a sidewall of the memory gate structure, wherein the memory gate structure is between the first spacer and the control gate structure;
after forming the first spacer, etching an upper surface of the memory gate structure; and
forming a top spacer over the memory gate structure.

9. The method of claim 8, wherein the first insulating layer and the second insulating layer comprise oxide layers, and wherein the charge storage layer comprises a nitride layer.

10. The method of claim 8, wherein the first insulating layer remains over the control gate structure after removing the portions of the second insulating layer and the charge storage layer.

11. The method of claim 8, wherein removing the portions of the second insulating layer and the charge storage layer recesses the second insulating layer and the charge storage layer under the memory gate structure.

12. The method of claim 8, wherein forming the top spacer forms a second spacer along sidewalls of the first spacer, wherein the first spacer is between the second spacer and the memory gate structure.

13. The method of claim 8, wherein forming the first insulating layer, the charge storage layer, and the second insulating layer comprises forming the first insulating layer, the charge storage layer, and the second insulating layer along a second sidewall of the control gate structure, and further comprising:
removing the second insulating layer and the charge storage layer from the second sidewall of the control gate structure, wherein forming the top spacer comprises forming a sidewall spacer on the first insulating layer on the second sidewall of the control gate structure.

14. The method of claim 8, wherein the top spacer comprises an oxide layer and a nitride layer on the oxide layer.

15. A method comprising:
forming a control gate structure over a substrate, wherein the control gate structure and the substrate are separated by a gate dielectric layer;
forming a charge storage layer over the control gate structure;
depositing a memory gate layer over the charge storage layer;
etching the memory gate layer to form a memory gate structure, wherein after etching a top surface of the memory gate structure is lower than a top surface of the charge storage layer;
etching the charge storage layer to recess the top surface of the charge storage layer lower than the top surface of the memory gate structure;
forming a first spacer along a sidewall of the memory gate structure;
etching the memory gate structure to recess the top surface of the memory gate structure lower than the top surface of the charge storage layer; and
forming a memory gate spacer over the memory gate structure, wherein the memory gate spacer is in direct contact with the memory gate structure.

16. The method of claim 15, further comprising:
prior to depositing the memory gate layer, forming an oxide layer over the charge storage layer, wherein etching the charge storage layer comprises etching the oxide layer.

17. The method of claim 16, wherein after etching the oxide layer, a top surface of the oxide layer is lower than the top surface of the memory gate structure.

18. The method of claim 15, further comprising, after forming the memory gate spacer, forming a first source/drain region adjacent the memory gate structure and forming a second source/drain region adjacent the control gate structure.

19. The method of claim 15, wherein the first spacer separates the sidewall of the memory gate structure from the memory gate spacer.

20. The method of claim 15, wherein after etching the memory gate structure to recess the top surface of the memory gate structure, the top surface of the memory gate structure lower is than a top surface of the first spacer.

* * * * *